United States Patent [19]

Groshong

[11] Patent Number: 5,159,374
[45] Date of Patent: Oct. 27, 1992

[54] WATER SEALING DEVELOP RING
[75] Inventor: Gary W. Groshong, Gilroy, Calif.
[73] Assignee: VLSI Technology, Inc., San Jose, Calif.
[21] Appl. No.: 680,203
[22] Filed: Apr. 4, 1991
[51] Int. Cl.⁵ .............................................. G03D 5/00
[52] U.S. Cl. ...................................... 354/317; 437/10
[58] Field of Search ............... 354/317, 298, 323, 324, 354/320; 134/1, 2, 153, 149, 157, 114; 437/9, 10, 13, 225

[56] References Cited
U.S. PATENT DOCUMENTS
4,922,277  5/1990  Carlson et al. ....................... 354/317

Primary Examiner—Michael L. Gellner
Assistant Examiner—D. Rutledge
Attorney, Agent, or Firm—Hickman & King

[57] ABSTRACT

During development of photoresist on the frontside of a semiconductor wafer, developer solution is prevented from contaminating the backside of a wafer by using a film of de-ionized water to seal the backside. The wafer is mounted to a vacuum chuck, which is in contact with the backside of the wafer. A ring member having a top surface is positioned adjacent to the backside of the wafer mounted to the vacuum-chuck. The film of de-ionized water is formed between the backside of the wafer and the ring so that the film of deionized water provides a seal to prevent developer solution from being drawn by vacuum pressure to the area on the backside of the wafer which is adjacent to the vacuum chuck. To aid in formation of the water sealing ring, the top surface of the ring if formed of a non-wetting material and a circular groove is formed in the top surface. A housing from which the ring projects provides a shield for developer solution. The housing includes an internal water channel for supplying de-ionized water and has a plurality of connecting channels between the internal water channel and the groove formed in the top surface of the ring. The backside of the wafer is also sprayed with a water rinse. Means are provided for draining water from the housing and for preventing a reduced pressure from existing within the housing.

20 Claims, 3 Drawing Sheets

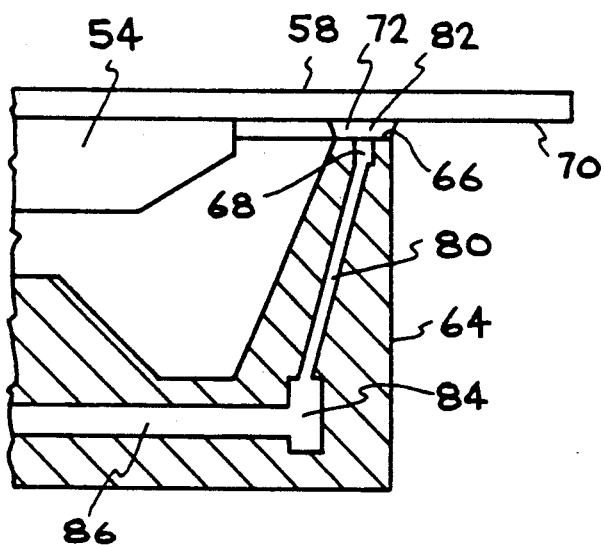
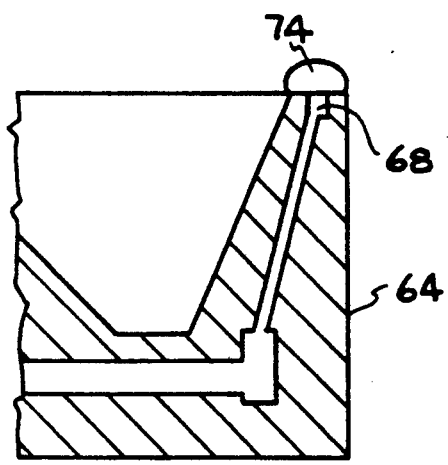
FIG. 3A
FIG. 3B
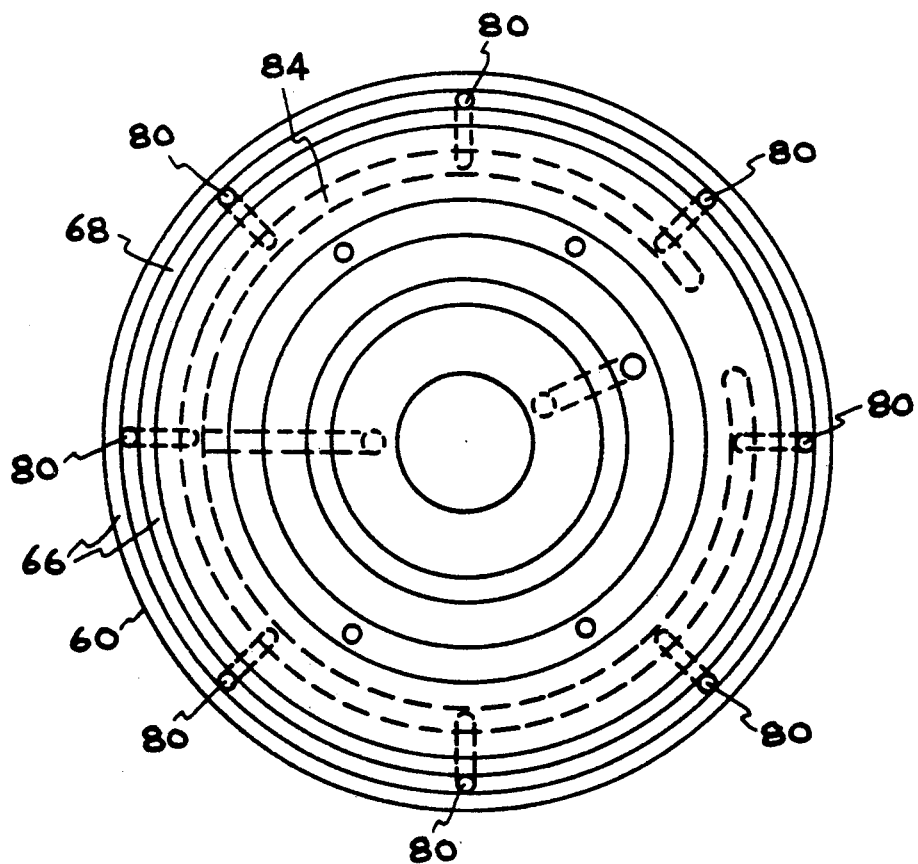
FIG. 4

WATER SEALING DEVELOP RING

BACKGROUND OF THE INVENTION

1. Field of the Invention

This invention relates to apparatus and methods for fabricating semiconductor integrated circuits and, more particularly, to apparatus and methods of preventing accumulation of developer solution on the backside of a semiconductor wafer.

2. Prior Art

In the fabrication of semiconductor integrated circuits, a layer of photoresist material is formed on the front surface of a semiconductor wafer. Using photolithographic techniques, various portions of the layer of photoresist material are selectively exposed to light using photo masks to thereby define various features on the wafer. The exposed photoresist material on the wafer is subsequently developed at a developing station using a developer solution, which removes exposed photoresist material, leaving a pattern in the remaining photoresist material for subsequently processing of the exposed areas of the wafer. At a photoresist developing station the wafer is held on a rotatable vacuum chuck, which contacts the backside of a wafer. Initially, the developer solution is dispensed onto the front surface of a slowly rotating, or spinning, wafer for initial wetting and even distribution of the developer solution. The spinning is stopped, and more developer solution is puddled onto the wafer surface and held for a period of time to complete the development step. The spent developer solution is subsequently removed from the wafer by rinsing the frontside and backside of the wafer with water. The water is removed by spinning the wafer at high speed and during a subsequent baking step for hardening the photoresist material.

During the developing step, a wafer is held in the vacuum chuck by vacuum pressure being applied to the backside of the wafer. Because of the vacuum pressure, developer solution tends to be drawn to the backside of the area adjacent to the vacuum chuck, where the developer solution is trapped between the surface of the chuck and the backside of the wafer. This trapped developer solution is not removed by the water rinse. Wafers which have developer solution on their backsides are called wetbacks. The problem with wetbacks is that the developer solution is a base-type material which will not dry, even when baked during the photoresist hardening step. The developer material can contaminate processing equipment, such as furnaces, in subsequent processing steps. The presence of residual developer material on the backside of a wafer also prevents a wafer from easily sliding in wafer-handling equipment. The wetback problem is a serious one and has been solved with varying degrees of effectiveness.

One prior-art solution to the wetback problem is the so-called air ring system. This system provides a ring having a surface which is held in very close proximity to the backside surface of a wafer. Pressurized air flows from inside the ring through a small gap between the surface of the ring and the surface of the backside of the wafer. As the air flows through the small gap, the air flow increases in velocity. In theory, this high-velocity air prevents the developer solution from entering the vacuum-pressure region between the chuck and the backside of a wafer, to prevent wetbacks. However, I have found that wetbacks still occur when this air ring technique is used. There are two problems with the air ring technique which explains how wetbacks still occur with the air ring technique.

The first problem concerns the difficulty maintaining the ring in close proximity to the backside of a wafer to maintain an optimum spacing in the air gap. A clearance of 0.005 inches is specified for the air gap. In a production environment, this clearance has been difficult to maintain because of mechanical vibrations associated with the developer process equipment.

The second problem concerns the difficulty with keeping the wafer and the ring coplanar. For optimum operation, the gap spacing must be maintained uniformly around the entire circumference of the ring. To maintain a uniform gap spacing requires an optimum chuck and spindle assembly. In addition, the ring must be mounted perfectly orthogonal to the spindle.

Because of the vibrations, the ring does not maintain proper clearance with the backside of a wafer. This results in frequent wetbacks or, worse, scratches on the back of a wafer from contact with the air ring. In practice, setup and maintenance of the air ring equipment for proper operation is difficult.

In the future, as lithography geometries in the integrated-circuit fabrication art continue to shrink, two additional problems will become more important. One of these problems has to do with developer solution being thrown from a wafer during rinse and dry cycles to form a mist. To prevent this mist from settling on the frontside of a wafer, vapors from the equipment are exhausted from the bottom of the equipment, away from the frontside of a wafer being processed. An air ring system also provides a flow of air into this exhaust stream, which decreases the efficiency of the exhaust system. Another problem has to do with the observation that contamination particles are more likely to be found in turbulent airstreams rather than in still air or in smoothly flowing airstreams. The air ring technique to reduce wetbacks uses a turbulent air flow and is therefore more likely to contain contaminants.

Consequently, the need exists for an effective technique of preventing wetbacks during the photoresist-development step of semiconductor wafer processing. That is, the needs exist for preventing develope solution from being available to be drawn by vacuum pressure to the area between the backside of a wafer being developed and the vacuum chuck on which the wafer is mounted.

SUMMARY OF THE INVENTION

It is therefore an object of the invention to provide a technique for sealing the vacuum chuck area of a photoresist developing station from developer solution.

In accordance with this and other objects of the invention, a system is provided for preventing developer solution from being present on the backside of a semiconductor wafer mounted to a rotatable vacuum-chuck during a photoresist-development step of a semiconductor fabrication process. The system includes a ring member having a top surface which is positioned adjacent to the backside of a wafer mounted to said vacuum-chuck. Means are provided for forming a film of de-ionized water between the backside of a wafer being processed and the ring. The film of de-ionized water providing a seal between the ring member and the backside of the wafer to prevent developer solution from being drawn by vacuum pressure to the interface area of the wafer and the vacuum chuck.

To aid in formation of the water sealing ring, the top surface of the ring is formed of a non-wetting material and a circular groove is formed in the top surface. A housing from which the ring projects provides a shield for developer solution. The housing includes an internal water channel and has a plurality of connecting channels between said internal water channel and the groove formed in the top surface of the ring.

Means are provided for rinsing the backside of the wafer with a water rinse and means are provided for draining water from the housing and for preventing a reduced pressure from existing within the housing.

A method is provided according to the invention for preventing developer solution from being present on the backside of a semiconductor wafer mounted to a rotatable vacuum-chuck during a photoresist-development step of a semiconductor fabrication process. The method includes the step of sealing a ring member to the backside of a wafer with a film of de-ionized water to prevent developer solution from being drawn by vacuum pressure from the vacuum-chuck on the backside of the wafer to the interface area between said wafer and said vacuum chuck. According to one aspect of the invention, the step of sealing the ring member to the backside of a wafer includes providing the film of de-ionized water from a circular groove formed in the top surface of the ring, where the circular groove is positioned substantially parallel to and spaced away a small distance from the backside surface of the wafer. In one preferred embodiment of the invention, the circular groove has a depth of 70 thousandths of an inch and a width of 50 thousandths of an inch. Water is provided from an internal water channel in a housing through a plurality of channels to the groove formed in the top surface of the ring. The method includes the step of rinsing the backside of the wafer with a water rinse and draining water from the housing. The method also includes the step of preventing a vacuum from existing within the housing by providing a vent to atmospheric pressure.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 3A is sectional view of a water-seal ring structure showing a supply channel connected to an internal water channel for supplying water to a groove formed in the top surface of the ring.

FIG. 3B is a sectional view of a water seal ring structure showing the groove formed in the top surface of the ring.

FIG. 4 is a top view of a water-seal ring system according to the invention.

DETAILED DESCRIPTION OF THE PREFERRED EMBODIMENTS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, the invention is intended to cover alternatives, modifications and equivalents, which may be included within the spirit and scope of the invention as defined by the appended claims.

Structure of the Invention

Figure 1:
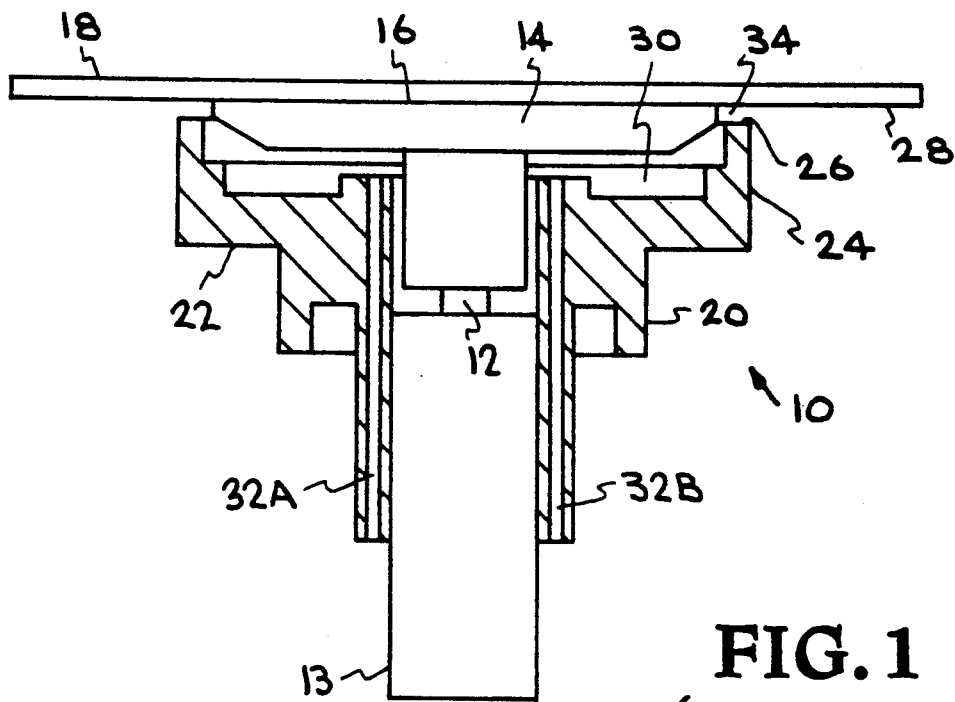
FIG. 1 is a partially cross-sectional view of a wafer mounted on a vacuum chuck of a spindle system which uses a prior art air-ring system for preventing wetbacks.

FIG. 1 shows a prior art air-ring system 10 for preventing wetbacks, that is, for preventing developer solution from contaminating the backside of a wafer during development of photoresist material on the wafer. A spindle shaft 12 is mounted to a support base 13 for rotation about a vertical axis. A motor is mounted in the support base for rotating the spindles shaft. A vacuum chuck 14 is mounted to one end of the spindle shaft 12. The top surface 16 of the vacuum chuck has a number of holes formed therein. These holes are connected through a passageway (not shown) in the spindle shaft 12 to a vacuum source. A semiconductor wafer 18 is held in a horizontal plane on the top surface 16 of the vacuum chuck 14 by vacuum pressure. The spindle shaft 12 and the attached vacuum chuck 14 can be moved vertically from the position shown in FIG. 1 to load and unload a wafer 18 from wafer-handling equipment. This arrangement allows the wafer 18 to be securely fixed to the rotating spindle shaft 12 during processing, especially when the wafer 18 is being rapidly spun around the vertical axis of the spindle shaft 12.

This conventional air-ring system 10 includes a stationary ring structure 20, which is shown in cross-section and which is mounted to the support base 13 with set screws (not shown). The ring structure 20 includes a base 22. The ring structure includes a ring portion 24, which extends vertically upward from the peripheral edge of the base 22. The ring 24 is concentric with the vertical axis of the spindle 12 and the spindle shaft 12 extends through the base 22 of the stationary ring structure 20. The ring 24 has a top horizontal surface 26. During application of developer solution to the frontside of the wafer 18, the spindle shaft 12 is vertically positioned as shown in FIG. 1 so that the top horizontal surface 26 of the ring 24 is held in very close proximity to the backside surface 28 of a wafer 18. The interior space 30 of the ring structure 20 contains pressurized air, which is provided through two air passages in the base 22. These air passages, typically shown as 32A and 32B, are formed through a cylindrical sleeve portion of the base 22 of the ring structure 20. Air flows from the interior space 30 inside the ring structure 20 through a uniformly small, circular air gap 34, which is located between the top horizontal surface 26 of the ring 24 and the backside surface 28 of the wafer 18. As the pressurized air flows through the small air gap 34, the air flow increases in velocity and creates an air ring. The air ring provides a barrier to, in theory, prevent developer solution from being drawn by vacuum pressure to the interface area between the top surface 16 of the vacuum chuck and the backside 28 of the wafer 18 to thereby prevent wetbacks.

A clearance of 0.005 inches is specified for the air gap 34. In a production environment, this clearance is difficult to maintain because of mechanical vibrations associated with the development process equipment. Because of these vibrations and lack of perfect alignment of a wafer and spindle, the ring 24 does not maintain proper clearance with the backside of a wafer to provide a precise, uniform air gap 34. This result in develope solution passing by the air ring and causing wetbacks.

Figure 2:
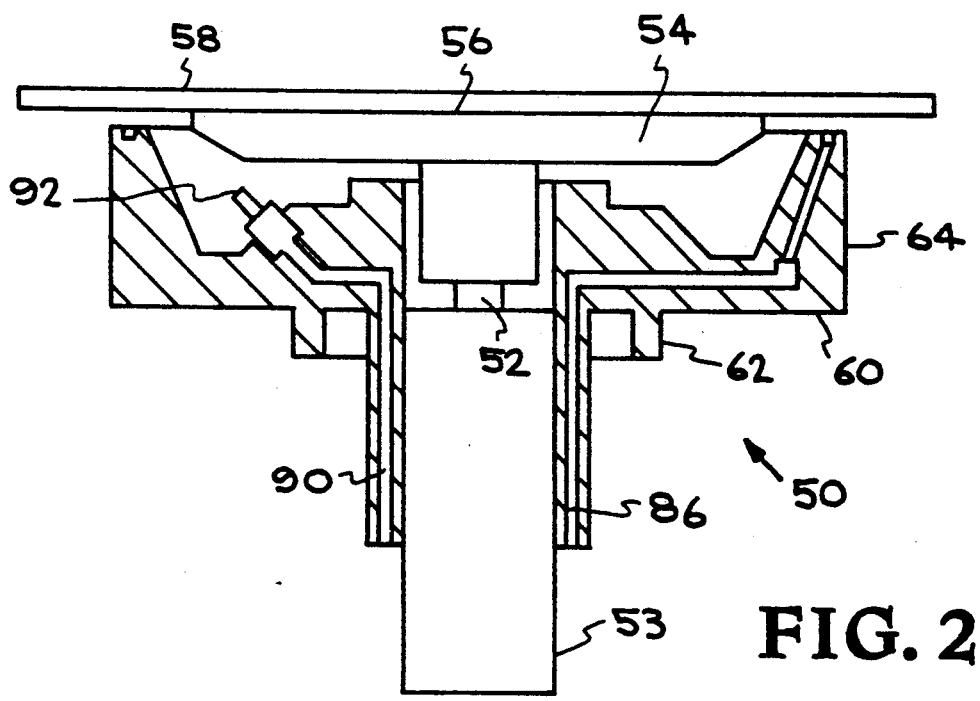
FIG. 2 is a partially cross-sectional view of a waterseal ring system for preventing wetbacks according to the invention.

FIG. 2 shows a cross-sectional view of a water-seal ring system 50 for preventing wetbacks according to the invention. A spindle shaft 52 is mounted to a support base 53 for rotation about a vertical axis. A motor is mounted in the support base 53 for rotating the spindle shaft 52. A vacuum chuck 54 is mounted to one end of the spindle shaft 52. The top surface 56 of the vacuum chuck has a number of holes formed therein. These holes are connected through a passageway (not shown) in the spindle to a vacuum source. A semiconductor wafer 58 is held in a horizontal plane on the top surface 56 of the vacuum chuck 54 by vacuum pressure. The spindle shaft 52 can be moved vertically from the operative position shown in FIG. 2 to load or unload a wafer 58 from conventional wafer-handling equipment.

The water-seal ring system 50 includes a stationary ring structure 60, which is shown in cross-section and which is mounted on the support base 62 with set screws. The ring structure 60 includes a laterally extending horizontal base member 62. The ring structure 60 includes a circumferential ring 64, which extends vertically upward from the peripheral edge of the base member 62. The ring 64 is concentric with the vertical axis of the spindle shaft 52. The spindle shaft 52 extends through the base member 62 of the stationary ring structure 60.

FIG. 3A is an enlarged sectional view of the circumferential ring 64 and a wafer 58. This Figure shows that the ring 64 has a top horizontal surface 66 in which is formed a circumferential groove 68. The circumferential groove 68 extends for 360 degrees around the ring 64 and is 70 thousandths of an inch deep and 50 thousandths of an inch wide. The top surface 66 of the ring 64 is nominally spaced apart 30 thousandths of an inch from the flat backside surface 70 of a wafer 58 to provide a gap 72. The spacing of the gap can be between 15 and 40 thousandths of an inch.

De-ionized water is provided to the circumferential groove 68 through a series of channels, typically shown as 80, to form a water seal 82 in the gap 72, as indicated in the drawings. The horizontal surface of the ring 64 is formed of a non-wetting material, such as polyvinyl chloride (PVC).

FIG. 3B is a sectional view of the ring 64 apart from a wafer. De-ionized water is in the channel 68. The de-ionized water does not wet the surface 66 and forms a convex meniscus 74, as shown in FIG. 3B. The backside surface 70 of the wafer 58 is a wetting surface for de-ionized water, so that a convex meniscus would form on the backside surface.

Referring to FIG. 3A, the water seal 82 is formed as a film of water with a convex meniscus at the non-wetted surface 66 of the ring 64 and a concave meniscus at the wetted backside surface 70 of the wafer 58.

FIG. 4 is a top view of the water-seal ring structure 60. Water is provided to the groove 68 through each of eight feeder tubes 80 (typically shown) from an internal water channel 84 formed in the ring 64.

Referring to FIGS. 2 and 3A, the internal water channel 84 is shown for supplying de-ionized water to the groove 60 through one of the feeder tubes 80. De-ionized water is provided to the internal water channel 84 through a supply conduit 86 which is formed through a cylindrical sleeve portion of the ring structure 60.

Referring to FIG. 2, an internal water channel 90 is provided in the ring structure 60 for supplying water to a rinse spray nozzle 92, as shown.

Figure 5:
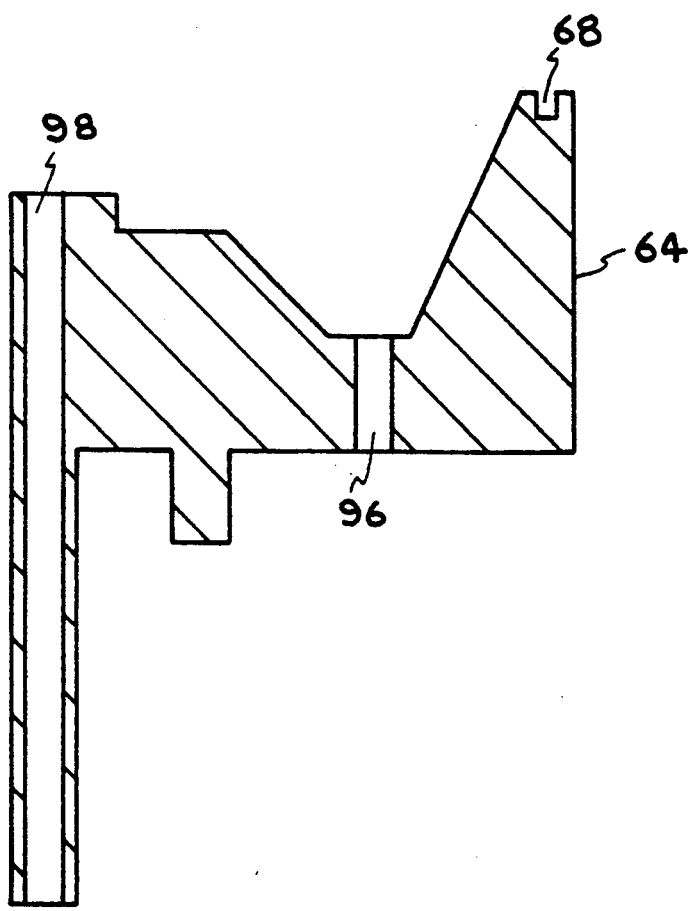
FIG. 5 is a sectional view of a water-seal ring structure showing a drain hole for draining water from the interior space of the ring.

FIG. 5 is a sectional view showing a drain hole 96 formed through the bottom wall 62 for draining water from the interior space of the ring structure. A pressure-equalization hole 98 is formed through the ring to prevent vacuum pressure from forming a low pressure region within the ring structure when the drain hole 96 may be clogged with an air bubble in the water.

Operation of the Invention

In operation, a seal is formed between the top surface 66 of the ring 64 and the backside surface 70 of the wafer 58 using de-ionized water, which is already available in photoresist developing installations. As indicated hereinabove, de-ionized water forms a convex meniscus on a flat non-wetting surface and forms a flat meniscus on a flat wetting surface. The ring 64 is formed of polyvinyl chloride material, which is non-wetting. De-ionized water in the groove 60 forms an upwardly extending convex meniscus until it touches the backside surface 70 of the wafer 54. If the wafer is spinning, the de-ionized water is thrown away from the ring amd wets the edge of the wafer.

During those parts of the developing process where the wafer is spinning, wetbacks cannot occur because the developer solution is thrown off by centrifugal force from the wetted wafer. When the wafer is not spinning, wetbacks can occur. As soon as a wafer stops, a ring of de-ionized water is formed to create a seal that is impenetrable by the develpor solution. The surface tension of the de-ionized water on the non-wetting surface of the ring keeps the water from draining off of the ring and breaking the seal. When the wafer starts to spin, the de-ionized water is thrown off and the seal is broken. In this case, developer solution mixes with the de-ionized water in the seal, but does not pass through the seal. The nozzle 92, which is located behind the ring and between the ring and the vacuum chuck is used to spray de-ionized water at a location just inside the ring and toward the outside of the wafer to rinse away any developer solution that may have otherwise contacted the backside of a wafer.

Four drain holes 96 are provided in the bottom wall 62 of ring structure to drain away any water that may be inside the ring structure. These drain holes are kept sufficiently small to prevent developer solution mist from passing through and contaminating the backside of a wafer. Because of their relatively small size, these drain holes can clog with air bubbles at times. If air bubbles seal all the drain holes, the relatively poor seal between the vacuum chuck and the backside of a wafer permits the vacuum pressure of the chuck to create a low-pressure region in the cavity formed between the wafer and the ring structure. This low pressure can break the de-ionized water seal between the ring and the wafer. Consequently, a pressure equalization hole is formed through the ring into the cavity area to prevent this low pressure from forming.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A system for preventing developer solution from accumulating on the backside of a semiconductor wafer mounted on its backside to a rotatable vacuum-chuck during a semiconductor fabrication process step in which developer solution is applied to the frontside of the semiconductor wafer, comprising:
    a ring member having a top surface which is positioned adjacent to the backside of a wafer mounted to said vacuum-chuck;
    means for providing a film of de-ionized water between the backside of said wafer being processed and the top surface of said ring member, said ring member and said film of de-ionized water providing a seal between the top surface of said ring member and the backside of the wafer to prevent developer solution from being drawn by vacuum pressure to an interface area of said wafer and said vacuum chuck.

2. The system of claim 1 wherein said means for providing a film of de-ionized water includes a groove formed in the top surface of said ring member for containing de-ionized water, wherein said groove is positioned substantially parallel to and spaced away from the backside surface of the wafer and wherein the film of de-ionized water is formed between said groove and the backside of said wafer.

3. The system of claim 1 wherein the top surface of said ring member is formed of a material which is non-wetting to de-ionized water.

4. The system of claim 1 wherein said vacuum chuck is mounted to a rotatable spindle shaft and wherein said ring member is mounted to a housing which has an aperture through which said rotatable spindle projects.

5. The system of claim 4 wherein said housing includes an internal channel for de-ionized water and includes a plurality of connecting channels between said internal water channel and the groove formed in the top surface of said ring.

6. The system of claim 4 wherein said housing means includes means for rinsing the backside of said wafer with a de-ionized water rinse.

7. The system of claim 4 wherein said housing means includes a drain aperture for draining de-ionized water from the interior space of said housing.

8. The system of claim 3 wherein said housing includes means for venting the interior space of the housing to prevent a reduced pressure from existing within said housing, where the reduced pressure is caused by vacuum pressure from the vacuum chuck.

9. The system of claim 1 wherein said groove has a depth of approximately 70 thousandths of an inch and a width of approximately 50 thousandths of an inch.

10. A chuck assembly for holding a semiconductor wafer on its backside while developer solution is being applied to its frontside, comprising:
    vacuum-chuck means, mounted to a rotatable spindle shaft, for mounting and rotating the wafer about the axis of said spindle shaft;
    a housing having a ring portion with a top surface which is positioned adjacent to the backside of the wafer mounted to the vacuum-chuck means, said ring portion having a groove formed in its top surface, said groove being positioned substantially parallel to and spaced away from the backside surface of the wafer;
    a film of de-ionized water located between said groove and adjacent portions of the back surface of the wafer to provide a water seal between said ring and the backside of said wafer to prevent developer solution from being present on the backside of said wafer.

11. A rotatable vacuum-chuck assembly for holding a semiconductor wafer during a photoresist developing step of a fabrication process, comprising:
    a rotatable spindle shaft to which is mounted a vacuum-chuck for holding a wafer;
    a housing surrounding said vacuum chuck, said housing having an aperture formed therein for said spindle shaft;
    said housing including a ring member having a top surface which is positioned adjacent to and spaced-apart from a backside of said wafer, said ring member including having a channel formed in its top surface;
    means for forming a film of de-ionized water between the backside of said wafer being processed and a non-wetting top surface of said ring member, said means including a groove formed in the top surface of said ring member and said film of de-ionized water providing a seal between the top surface of said ring member and the backside of the wafer to prevent developer solution from being drawn by vacuum pressure to a interface area of said wafer and said vacuum chuck, wherein the groove is positioned substantially parallel to and spaced away from the backside surface of the wafer.

12. The system of claim 11 wherein said vacuum chuck is mounted to a rotatable spindle shaft and wherein said ring member is mounted to a housing which has an aperture through which said rotatable spindle projects.

13. The system of claim 12 wherein said housing includes an internal channel for de-ionized water and includes a plurality of connecting channels between said internal water channel and the groove formed in the top surface of said ring.

14. The system of claim 12 wherein said housing means includes means for rinsing the backside of said wafer with a de-ionized water rinse.

15. The system of claim 12 wherein said housing includes means for venting the interior space of the housing to prevent a reduced pressure from existing within said housing, where the reduced pressure is caused by vacuum pressure from the vacuum chuck.

16. A method for preventing developer solution from being present on a backside of a semiconductor wafer mounted to a rotatable vacuum-chuck during a photoresist developer step of a semiconductor fabrication process, comprising the step of sealing a ring member to the backside of a wafer with a film of de-ionized water to prevent developer solution from being drawn by vacuum pressure from the vacuum-chuck on the backside of the wafer to the interface area between said wafer and said vacuum chuck.

17. The method of claim 16 wherein the step of sealing the ring member to the backside of a wafer includes providing de-ionized water for the film of de-ionized water from a groove formed in the top surface of the ring, where the groove is positioned substantially parallel to and spaced away from the backside surface of the wafer.

18. The method of claim 16 including the steps of:
rotating the vacuum chuck on a spindle shaft which extends through a housing to which the ring is mounted to spin developer solution away from the backside of said wafer; and
forming the film of de-ionized water when the spindle shaft stops rotating.

19. The method of claim 16 including the step of rinsing the backside of said wafer with a de-ionized water rinse.

20. The method of claim 16 including the step of venting said housing to atmospheric pressure to prevent a vacuum from existing within said housing.

* * * * *